(12) United States Patent
Chen et al.

(10) Patent No.: US 9,653,511 B2
(45) Date of Patent: May 16, 2017

(54) CMOS IMAGE SENSOR WITH PENINSULAR GROUND CONTRACTS AND METHOD OF MANUFACTURING THE SAME

(71) Applicant: OmniVision Technologies, Inc., Santa Clara, CA (US)

(72) Inventors: Gang Chen, San Jose, CA (US); Duli Mao, Sunnyvale, CA (US); Dyson Hsinchin Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/823,683

(22) Filed: Aug. 11, 2015

(65) Prior Publication Data

US 2017/0047370 A1 Feb. 16, 2017

(51) Int. Cl.
*H01L 27/146* (2006.01)

(52) U.S. Cl.
CPC .... *H01L 27/14643* (2013.01); *H01L 27/1463* (2013.01); *H01L 27/14612* (2013.01); *H01L 27/14636* (2013.01); *H01L 27/14689* (2013.01)

(58) Field of Classification Search
CPC ......... H01L 27/14609; H01L 27/14643; H01L 27/14603; H01L 27/14689; H01L 27/1463
See application file for complete search history.

(56) References Cited

U.S. PATENT DOCUMENTS

| 4,972,244 A * | 11/1990 | Buffet ................. H01L 27/1446 257/442 |
| 8,686,477 B2 | 4/2014 | Manabe et al. |
| 2012/0235212 A1 | 9/2012 | Chen et al. |
| 2014/0239152 A1 | 8/2014 | Chen et al. |
| 2015/0091122 A1 | 4/2015 | Okazaki et al. |

FOREIGN PATENT DOCUMENTS

TW    201301488 A1    1/2013

OTHER PUBLICATIONS

Office Action corresponding to Taiwanese Patent Application No. 105121973, dated Dec. 22, 2016, 5 pages.

* cited by examiner

*Primary Examiner* — Quoc Hoang
(74) *Attorney, Agent, or Firm* — Lathrop & Gage LLP (57) ABSTRACT

A complementary metal oxide semiconductor (CMOS) image sensor with peninsular ground contacts includes (a) a substrate having a plurality of pixel units arranged in rows of pixel units and (b) a plurality of ground contacts for grounding the pixel units, wherein the ground contacts are formed in respective peninsular regions of the substrate within respective ones of the pixel units, and wherein each of the peninsular regions is only partly enclosed by a shallow trench isolation and the peninsular regions have alternating orientation along each of the rows of pixel units.

20 Claims, 7 Drawing Sheets

CMOS IMAGE SENSOR WITH PENINSULAR GROUND CONTRACTS AND METHOD OF MANUFACTURING THE SAME

BACKGROUND

The vast majority of digital cameras sold to the general consumer are based on complementary metal oxide semiconductor (CMOS) image sensors since CMOS image sensors may be manufactured in large volumes at low cost. CMOS image sensors are produced at the wafer-level on silicon substrates and the manufacturing involves appropriately doping spatially distinct areas of the wafer to produce local features having different types and degrees of doping, namely various degrees of p type doping (positive charge carriers) and various degrees of n type doping (negative charger carriers).

Each pixel of a CMOS image sensor has a photodiode for generating electrical charge in response to incident light. The photodiode is coupled with a set of transistors for reading out the electrical charge to generate an image signal and for resetting the pixel after readout. Typically, three or more transistors cooperate to read out the electrical charge and reset the pixel. The transistors are formed in/on the silicon substrate next to the photodiode in one or more "islands" separated from the surrounding components by shallow-trench isolation. Shallow-trench isolation is an etched trench filled with a dielectric.

Consumers have become accustomed to digital photography producing excellent image quality, and the demand for higher spatial resolution is ever increasing. To meet this demand, CMOS image sensors are produced with a very large number of pixels, which leads to a significant lateral resistance in the substrate between centrally located pixels and the perimeter of the pixel array. As a result, a peripheral ground contact does not provide a uniform ground plane for the entire pixel array. This problem may be overcome by placing a ground contact in each pixel.

SUMMARY

In an embodiment, a complementary metal oxide semiconductor (CMOS) image sensor with peninsular ground contacts includes (a) a substrate having a plurality of pixel units arranged in rows of pixel units and (b) a plurality of ground contacts for grounding the pixel units. The ground contacts are formed in respective peninsular regions of the substrate within respective ones of the pixel units. Each of the peninsular regions is only partly enclosed by a shallow trench isolation and the peninsular regions have alternating orientation along each of the rows of pixel units.

In an embodiment, a method for manufacturing a CMOS image sensor with peninsular ground contacts includes producing shallow trench isolations in a substrate to form a plurality of parallel rows of transistor areas, such that each of the transistor areas includes (a) at least one island for accommodating one or more transistors and (b) a peninsular region for accommodating a ground contact. Each of the at least one island is fully enclosed by a portion of the shallow trench isolations. The peninsular region is only partly enclosed by a portion of the shallow trench isolations and the orientation of the peninsular region alternates along each of the rows.

DETAILED DESCRIPTION OF THE EMBODIMENTS

Figure 1:
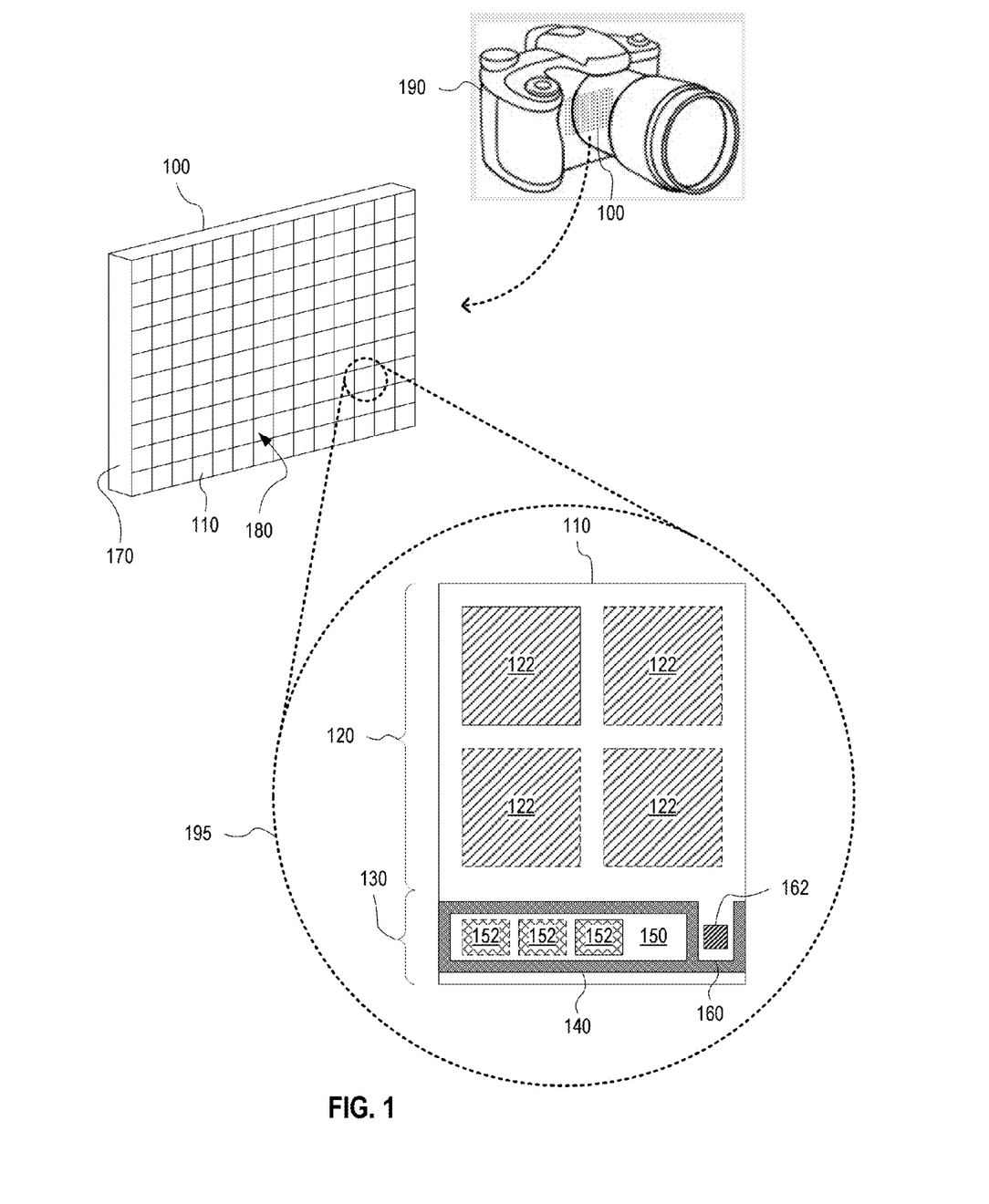
FIG. 1 illustrates a complementary metal oxide semiconductor (CMOS) image sensor with peninsular ground contacts, according to an embodiment.

FIG. 1 illustrates one exemplary complementary metal oxide semiconductor (CMOS) image sensor 100 with peninsular ground contacts 162. FIG. 1 shows image sensor 100 in an exemplary scenario, wherein image sensor 100 is implemented in an electronic camera 190 for capture of images by electronic camera 190. Image sensor 100 includes a substrate 170 with a plurality of pixel units 110 for detection of light incident onto a light-receiving surface 180 of image sensor 100. For clarity of illustration, not all pixel units 110 are labeled within image sensor 100. As shown in close-up 195, each pixel unit 110 includes one or more photodiodes 122, one or more transistors 152, and a ground contact 162. Close-up 195 shows pixel unit 110 as viewed along a viewing direction orthogonal to light-receiving surface 180. Each photodiode 122 is located in a photodiode area 120. Each transistor 152 is located in a transistor area 130. Transistor area 130 is located along one side of photodiode area 120. Ground contact 162 is also located in transistor area 130. Within each pixel unit 110, each photodiode 122 cooperates with transistor(s) 152 and ground contact 162 to form one pixel of image sensor 100. In one embodiment, photodiode area 120 includes only a single photodiode 122. In another embodiment, photodiode area 120 includes two or more photodiodes 122, for example four photodiodes 122.

Transistor area 130 includes shallow trench isolation 140 forming an island 150 and a peninsular region 160. Peninsular region 160 is only partly surrounded by shallow trench isolation 140. Herein, "island" refers to a portion of substrate 170 fully surrounded by shallow trench isolation 140, and "peninsular region" refers to a portion of substrate 170 only partly surrounded by shallow trench isolation 140. In the embodiment shown in FIG. 1, peninsular region 160 is rectangular with shallow trench isolation 140 along three sides of the rectangle and without shallow trench isolation 140 along the fourth side of the rectangle. Without departing from the scope hereof, peninsular region 160 may have shape different from that of a rectangle and/or peninsular region 160 may be more or less surrounded by shallow trench isolation 140 than shown in FIG. 1. For example, peninsular region 160 may be rectangular, have shallow trench isolation 140 along the full extent of three sides of the rectangle, and in addition have shallow trench isolation 140 along a portion of the fourth side of the rectangle.

In one embodiment, substrate 170 is generally p doped and ground contact 162 is a p+ doped portion of peninsular region 160, wherein "p+" indicates a portion more highly p-doped than the immediate surroundings of substrate 170. In another embodiment, substrate 170 is generally n-doped and ground contact 162 is a n+ doped portion of peninsular region 160, wherein "n+" indicates a portion more highly n-doped than the immediate surroundings of substrate 170. In one embodiment, substrate 170 is substantially silicon. In another embodiment, substrate 170 is substantially silicon or a silicon derivative. In yet another embodiment, substrate 170 is substantially germanium and/or silicon-germanium alloy.

With ground contact 162 being placed in transistor area 130, the configuration of image sensor 100 is well-suited for implementation in high-resolution image sensors. Each pixel unit 110 has its own ground contact 162 to uniformly, or at least near-uniformly, ground pixel units 110 across image sensor 100. In addition, high-resolution image sensors often have relatively small pixels in order to accommodate the required large number of pixels within a practical area. In one exemplary embodiment, each pixel unit 110 includes four photodiodes 122 that are each about one micron by one micron in size such that photodiode area 120 is approximately two microns by two microns in size. With photodiode area 120 of such small size and nearly fully occupied by photodiodes 122 (and any other semiconductor components located within photodiode area 120), placement of ground contact 162 within photodiode area 120 would likely result in the doping properties of ground contact 162 compromising the performance of one or more photodiodes 122 within pixel unit 110. Image sensor 100 instead places ground contact 162 in transistor area 130.

As further discussed below, placement of ground contact 162 in peninsular region 160, as opposed to in an island fully surrounded by shallow trench isolation 140, facilitates improved space utilization of transistor area 130 without causing stress-induced noise as would results from ground contact 162 being placed in a small island.

Although not shown in FIG. 1, photodiode area 120 may include one or more transistors, such as a transfer gate for each photodiode 122, without departing from the scope hereof. Also, without departing from the scope hereof, photodiode area 120 may include any number of photodiodes 122 greater than zero and transistor area 130 may include any number of transistors 152 greater than zero. Furthermore, as illustrated by example below in FIGS. 8A and 8B, shallow trench isolation 140 may form two or more islands 150 in transistor area 130, wherein each of such two or more islands 150 includes at least one transistor 152. Ground contact 162 may occupy more or less of peninsular region 160 than shown in FIG. 1, without departing from the scope hereof. Also without departing from the scope hereof, image sensor 100 may include a different number of pixel units 110 than shown in FIG. 1. In one example, image sensor 100 includes hundreds or thousands of rows of pixel units 110, wherein each row includes hundreds or thousands of pixel units 110.

In certain embodiments, each photodiode 122 within photodiode area 120 is associated only with transistors 152 located in transistor area 130, and optionally also with (a) one or more transistors located within photodiode area 120 and/or (b) one or more transistors separate from image sensor 100. In this embodiment, readout of image signal from each photodiode 122 does not utilize transistors located adjacent to other sides of photodiode area 120 than the side of photodiode region 120 occupied by transistor area 130.

Figure 2A:
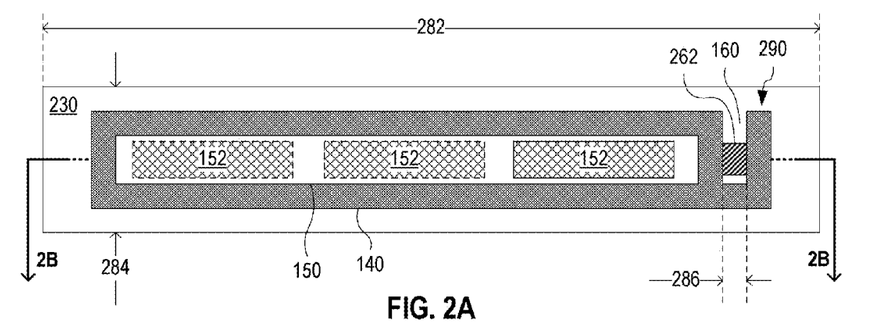
FIGS. 2A and 2B illustrate a transistor area with a peninsular ground contact, according to an embodiment.
Figure 2B:
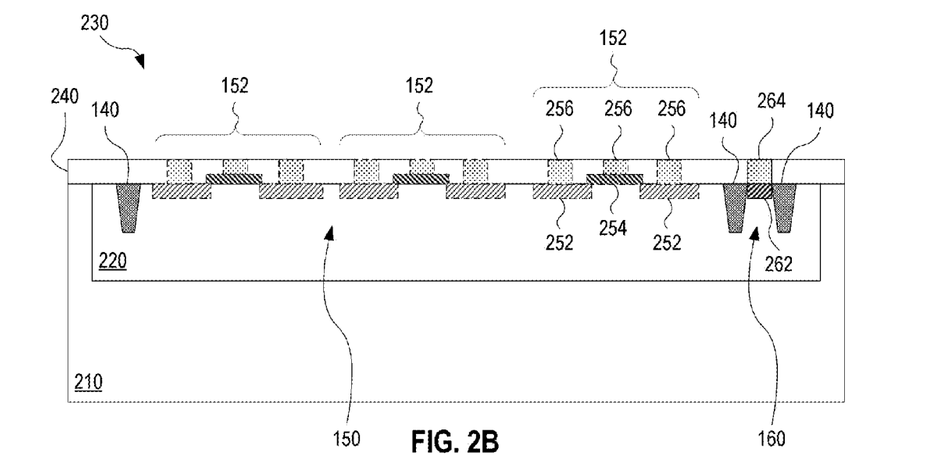

FIGS. 2A and 2B illustrate one exemplary transistor area 230 that is an embodiment of transistor area 130. FIG. 2A shows transistor area 230 in the same view as used for transistor area 130 in FIG. 1. FIG. 2B shows transistor area 230 in a cross-sectional view taken along line 2B-2B of FIG. 2A. FIGS. 2A and 2B are best viewed together.

Transistor area 230 is elongated and has a longer dimension 282 and a shorter dimension 284. Transistor area 230 implements ground contact 162 as a ground contact 262 that spans the width 286 of peninsular region 160, wherein width 286 is parallel to longer dimension 282, such that ground contact 162 spans across peninsular region 160 from one portion of shallow trench isolation 140 to another portion of shallow trench isolation 140. Since ground contact 262 spans width 286, width 286 may be chosen smaller than the width of a peninsular region that is greater than the span of ground contact 262. This minimizes the extent, along longer dimension 282 of transistor area 230, used to accommodate ground contact 262.

In transistor area 230, substrate 170 is implemented as a p− doped epitaxial silicon 210 with a p doped well 220, wherein "p" doped well 220 is more highly doped than "p−" doped epitaxial silicon 210. Ground contact 262 is p+ doped. Shallow trench isolation 140 is within p doped well 220. Transistor area 230 includes a connection layer 240 with a connection 264 that contacts ground contact 262. Connection 264 is metal, for example. Connection 264 may match width 286 of ground contact 262, be smaller than ground contact 262, or be larger than ground contact 262.

Transistor area 230 may implement each of one or more transistors 152 as two n doped portions 252 embedded in p doped well 220 and a polysilicon gate 254 spanning between the two n doped portions 252. Connection layer 240 includes connections 256 for transistor(s) 152. Connections 256 are metal, for example. For clarity of illustration, connection 264 and components of transistor(s) 152 are not shown in FIG. 2A. Without departing from the scope hereof, shallow trench isolation 140 may extend across all of longer dimension 282 as illustrated by example in FIGS. 4 and 6.

In an alternative embodiment, the doping properties of transistor area 230 are reversed such that p− doped epitaxial silicon is replaced by n− doped epitaxial silicon, p doped well 220 is replaced by an n doped well, ground contact 262 is replaced by an n+ doped ground contact, and so on for all components of transistor area 230.

Figure 3:
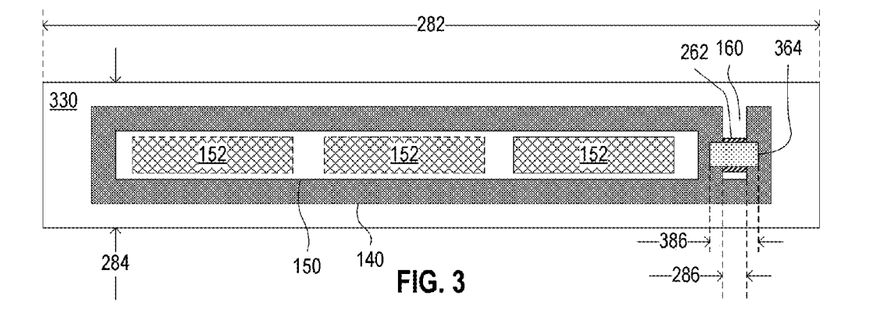
FIG. 3 illustrates one exemplary transistor area with a connection to a peninsular ground contact that is wider than the peninsular ground contact, according to an embodiment.

FIG. 3 illustrates one exemplary transistor area 330 with a connection 364 to ground contact 262 that is wider than ground contact 262. Transistor area 330 is an embodiment of transistor area 230 and connection 364 is an embodiment of connection 264. Connection 364 has width 386 along longer dimension 282. Width 386 is greater than width 286, such that connection 364 extends over shallow trench isolation 140 on both sides of peninsular region 160 along dimension 282.

Figure 4:
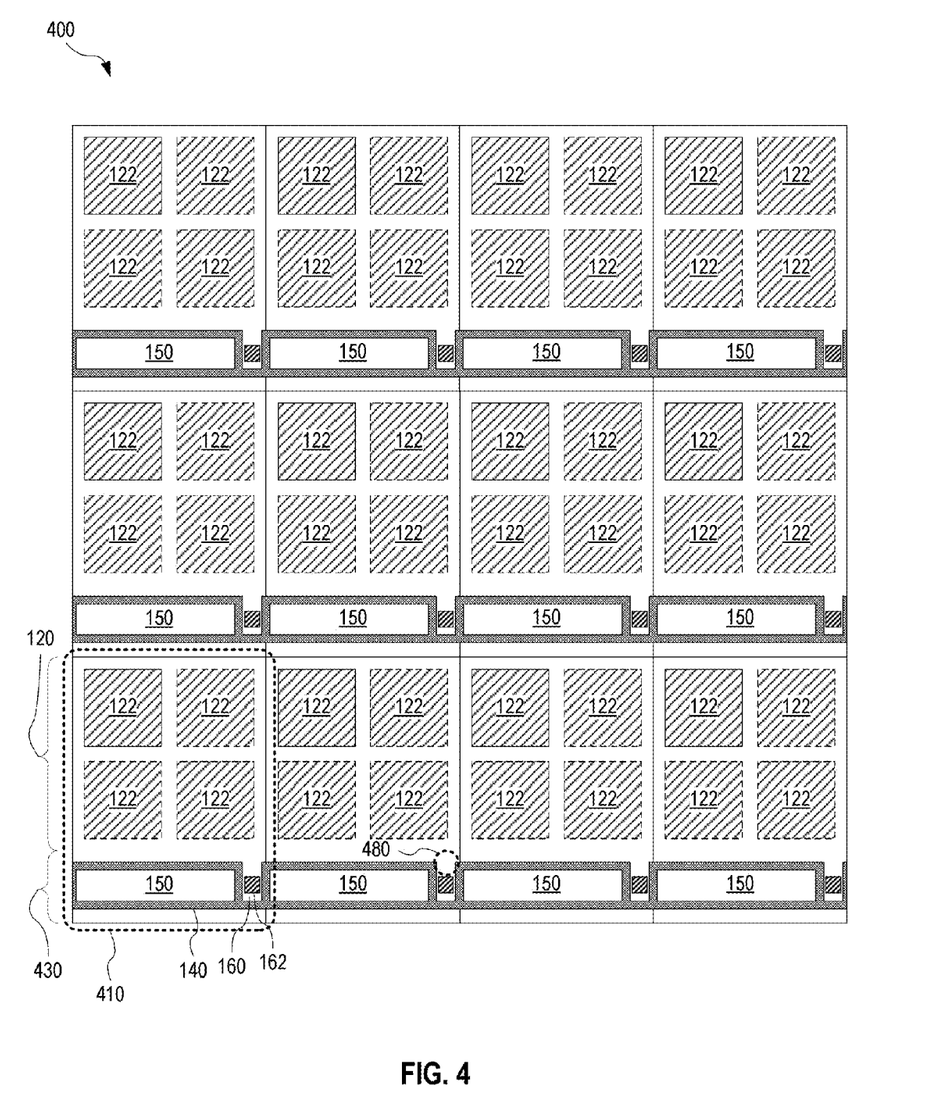
FIG. 4 illustrates a CMOS image sensor with peninsular ground contacts located in identically oriented peninsular regions, according to an embodiment.

FIG. 4 illustrates one exemplary CMOS image sensor 400 with peninsular ground contacts 162 located in identically oriented peninsular regions 160. Image sensor 400 is an embodiment of image sensor 100. Image sensor 400 includes a plurality of pixel units 410 placed to form rows of photodiode areas 120 and rows of transistor areas 430. Pixel unit 410 is an embodiment of pixel unit 110. Transistor area 430 is an embodiment of transistor area 130, in which shallow trench isolation 140 spans the full width of transistor area 130 such that shallow trench isolation 140 forms a contiguous shallow trench isolation across each row of transistor areas 430. Transistor area 430 may implement transistor area 230 or transistor area 330. All pixel units 410 are arranged identically such that peninsular region 160 has the same orientation in all of pixel units 410.

For clarity of illustration, not all pixel units 410 and elements thereof are labeled in FIG. 4. Without departing from the scope hereof, image sensor 400 may include a different number of pixel units 410 than shown in FIG. 4. In one example, image sensor 400 includes hundreds or thousands of rows of pixel units 410, wherein each row includes hundreds or thousands of pixel units 410.

Figure 5:
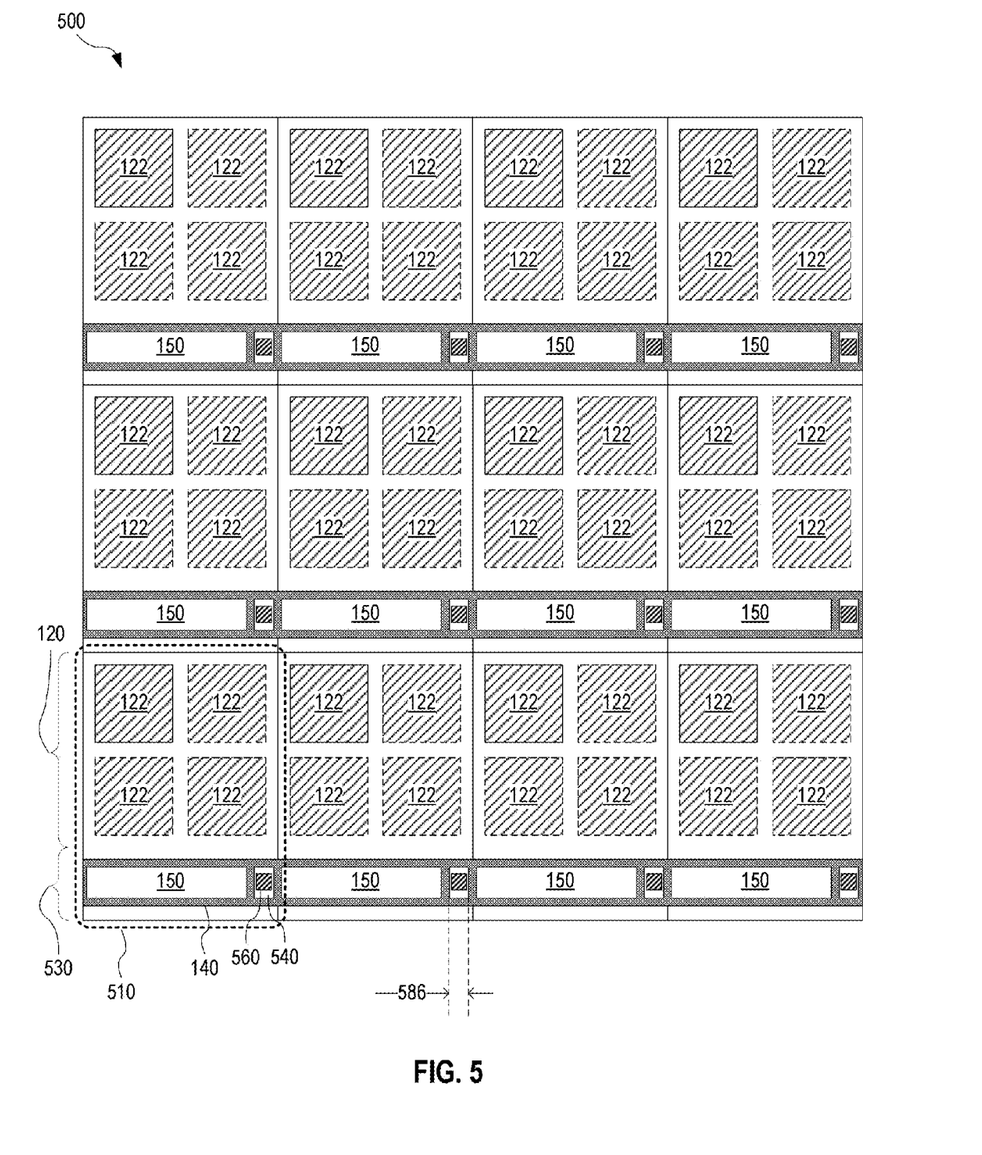
FIG. 5 illustrates a CMOS image sensor with ground contacts located in islands as opposed to in peninsular regions.

FIG. 5 illustrates, for comparison, a CMOS image sensor 500 with ground contacts 560 located in islands 540 as opposed to in peninsular regions 160. Image sensor 500 is similar to image sensor 400 except for image sensor 500 implementing a pixel unit 510 that includes a transistor area 530. Transistor area 530 is similar to transistor area 430 except for peninsular regions 160 being replaced by islands 540. In embodiments where the width 586 of island 540 is small, corresponding to a small width 286, excessive stress on both island 150 and island 540 results from the small value of width 586. This stress is exerted is exerted on the crystalline structure of the underlying substrate (e.g., substrate 170) as well as the interface between the substrate and shallow trench isolation 140, resulting in unwanted mobile and fixed charge carriers that, in turn, cause noise in the image signals generated by pixel units 510.

In contrast, the "bridge" (indicated in FIG. 4 as oval 480) that interrupts shallow trench isolation 140 at peninsular regions 160 of image sensor 100 and image sensor 400 at least partly releases this stress to reduce or eliminate such stress-induced noise.

Figure 6:
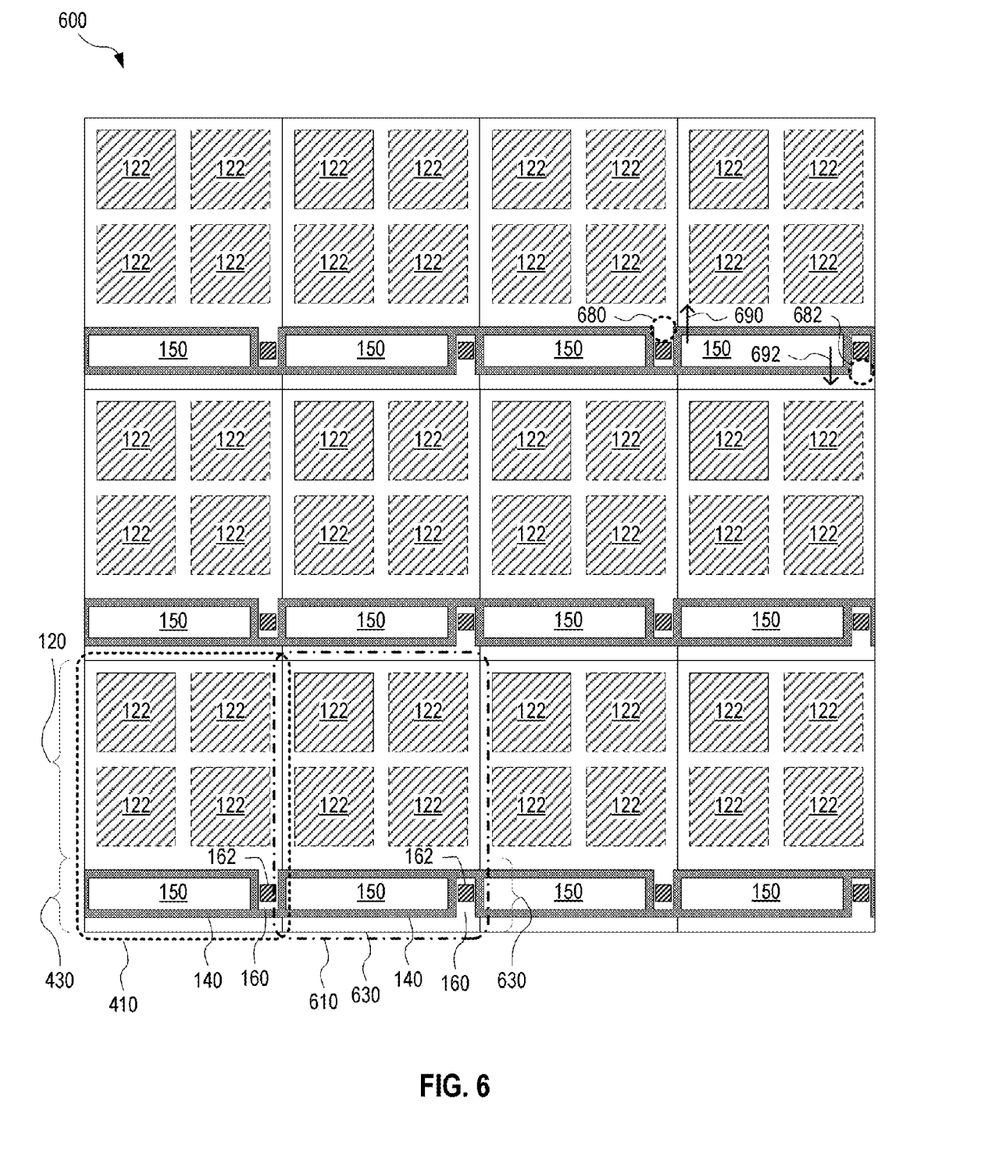
FIG. 6 illustrates a CMOS image sensor with peninsular ground contacts located in peninsular regions of alternating orientation, according to an embodiment.

FIG. 6 illustrates one exemplary CMOS image sensor 600 with peninsular ground contacts 162 located in peninsular regions 160 of alternating orientation. Image sensor 600 is an embodiment of image sensor 100 and is similar to image sensor 400 except for alternating the orientation of peninsular regions 160. Image sensor 600 includes a plurality of pixel units 410 and pixel units 610. Pixel unit 610 is an embodiment of pixel unit 110 and is similar to pixel unit 410, except for implementing a transistor area 630 with peninsular region 160 oriented opposite the orientation of peninsular region 160 in pixel unit 410. Transistor area 630 is otherwise similar to transistor area 430.

Pixel units 410 and pixel units 610 are arranged in rows placed to form rows of photodiode areas 120 and rows of transistor areas 430 and 630, wherein transistor areas 430 and 630 alternate along each such row. As a result, the orientation of peninsular regions 160 along each row of transistor areas 430 and 630 alternates between having (a) a bridge 680 interrupting shallow trench isolation 140 in one direction 690 orthogonal to the rows of transistor areas 430 and 630 and (b) a bridge 682 interrupting shallow trench isolation 140 in another direction 692 orthogonal to the rows of transistor areas 430 and 630, wherein direction 690 and 692 are opposite.

By virtue of the alternating orientation of peninsular regions 160 along each row of transistor areas 430 and 630, any directionally biased noise introduced by ground contacts 162 and/or peninsular regions 160 alternates between affecting photodiode signals from above and below the row of transistor areas 430 and 630. If such directionally biased noise is present, images captured by image sensor 600 may include a relatively uniform distribution of the directionally biased noise. On the other hand, in images captured by image sensor 400, the directionally biased noise may appear as lines.

For clarity of illustration, not all pixel units 410 and 610, nor all elements thereof, are labeled in FIG. 6. Without departing from the scope hereof, image sensor 600 may include a different number of pixel units 410 and 610 than shown in FIG. 5. In one example, image sensor 400 includes hundreds or thousands of rows of pixel units 410/610, wherein each row includes hundreds or thousands of pixel units 410/610.

Without departing from the scope hereof, CMOS image sensor 600 is readily extended to each row of transistor areas 430 and 630 being configured according to a different scheme of alternation. For example, instead of being configured as a series of transistor areas 430, 630, 430, 630, etc., each row of transistor areas 430 and 630 may be configured as a series of transistor areas 430, 430, 630, 630, 430, 430, 630, 630, etc. In one alternate embodiment, each row of transistor areas 430 and 630 has a random or near-random distribution of transistor areas 430 and 630.

Figures 7, 8A:
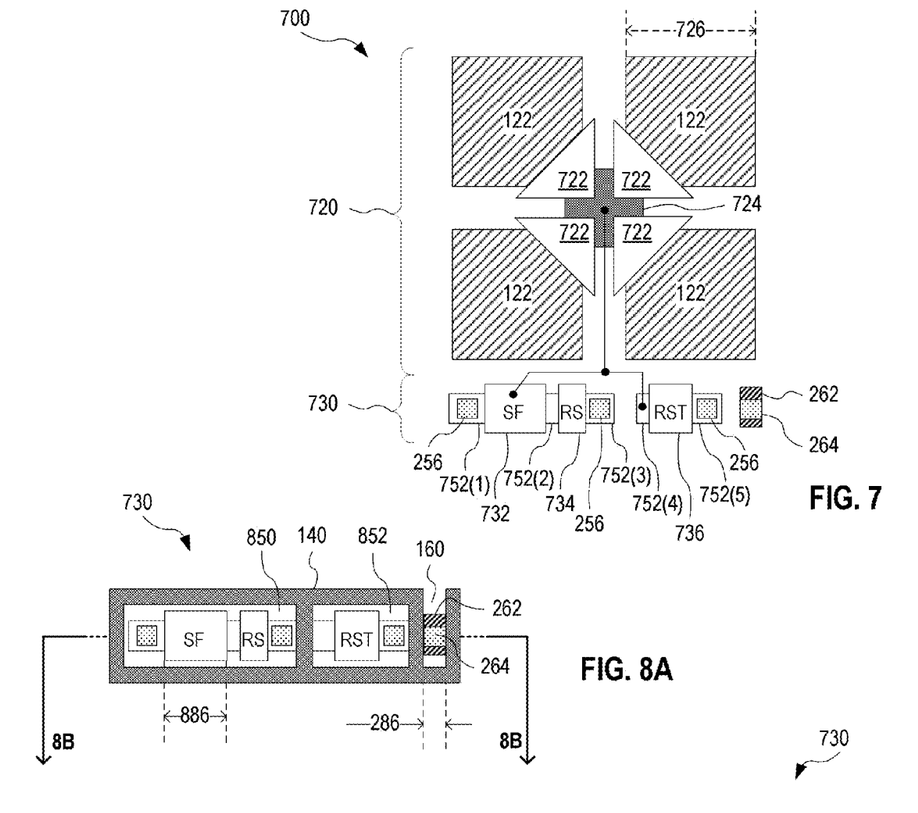
FIG. 7 shows the layout of functional components of a 4T pixel unit with a peninsular ground contact, according to an embodiment.
FIGS. 8A and 8B illustrate the transistor area of the 4T pixel unit of FIG. 7 in further detail, according to an embodiment.

FIG. 7 shows the layout of functional components of one exemplary 4T pixel unit 700 with a peninsular ground contact 262. Pixel unit 700 is an embodiment of pixel unit 110. Pixel unit 700 includes four photodiodes 122 located in a photodiode area 720. Each photodiode 122 has side length 726. Side length 726 is for example between 1.0 and 1.2 microns. Photodiode area 720 is an embodiment of photodiode area 120. Photodiode area 720 further includes a floating diffusion region 724 and four transfer gates 722. Each transfer gate 722 contacts floating diffusion region 724 and a respective photodiode 122.

Pixel unit 700 also includes peninsular ground contact 262, a source follower transistor, a row select transistor, and a reset transistor located in a transistor area 730. Transistor area 730 is an embodiment of transistor area 230. The source follower transistor is formed by n doped portions 752(1) and 752(2), and a polysilicon source follower (SF) gate 732 spanning therebetween. The row select transistor is formed by n doped portions 752(2) and 752(3), and a polysilicon row select (RS) gate 734 spanning therebetween. The reset transistor is formed by n doped portions 752(4) and 752(5), and a polysilicon reset (RST) gate 736 spanning therebetween. SF gate 732 and n doped portion 752(4) are communicatively coupled with floating diffusion region 724. Transistor area 730 further includes connection 264 and connections 256 for n doped portions 752(1-5), SF gate 732, RS gate 734, and RST gate 736. For clarity of illustration, not all connections 256 are shown in FIG. 7. Each of SF gate 732, RS gate 734, and RST gate 736 is an embodiment of polysilicon gate 254. Each of the source follower transistor, the row select transistor, and the reset transistor is an embodiment of transistor 152.

Figure 8B:
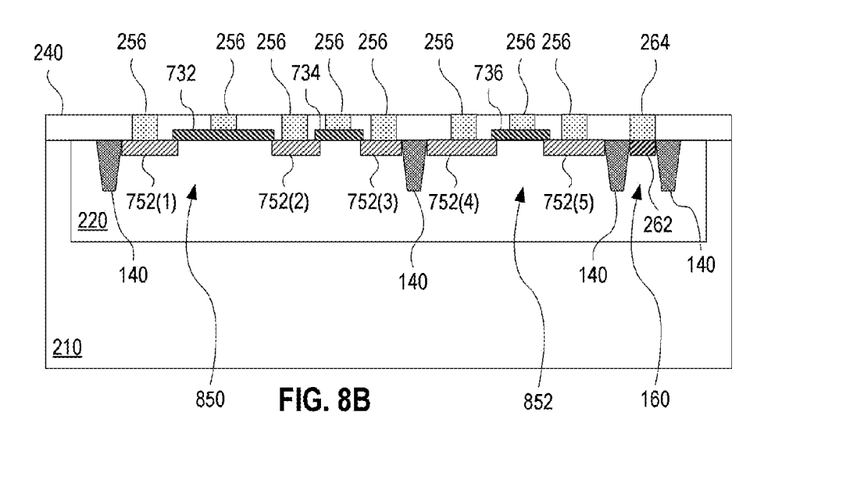

FIGS. 8A and 8B illustrate transistor area 730 in further detail. FIG. 8A shows transistor area 730 in the same view as used in FIG. 2A. FIG. 8B shows a cross sectional view of transistor area 730 taken along line 8B-8B of FIG. 8A. This view is similar to the view used in FIG. 2B. FIGS. 8A and 8B are best viewed together. Transistor area 730 may be implemented in image sensor 100, in image sensor 400, and in image sensor 600.

Transistor area 730 includes shallow trench isolation 140 configured to form (a) an island 850 that accommodates the source follower transistor and the row select transistor, (b) an island 852 that accommodates the reset transistor, and (c)

peninsular region 160 that accommodates ground contact 262. For clarity of illustration, not all components are labeled in FIG. 8A.

SF gate 732 has width 886, and each of peninsular region 160 and ground contact 262 has width 286. In an embodiment, width 286 is less than 0.15 microns and width 886 is at least 0.4 microns. In one example of this embodiment, side length 726 is between 1.0 and 1.2 microns. In this example, if width 286 was greater than 0.15 microns, the elements of transistor area 730 would not be able to fit within a space of width similar to that of photodiode area 720 without sacrificing the extent of width 886. If width 886 is decreased, random telegraph noise increases. Transistor area 730, by virtue of peninsular region 160 and ground contact 262, facilitates placing a ground contact in pixel unit 700 without suffering from increased random telegraph noise caused by an insufficient width 886.

Without departing from the scope hereof, shallow trench isolation 140 may extend across the full width of transistor area 730, as discussed for transistor area 230 in reference to FIGS. 2A and 2B. Also without departing from the scope hereof, the order of transistors relative to each other and/or the order of peninsular region 160 relative to islands 850 and 852 may be different from the order shown in FIGS. 8A and 8B. For example, peninsular region 160 may be located to the left of island 850 (in the views of FIGS. 8A and 8B), or in between islands 850 and 852. Likewise, the order of the source follower transistor and the row select transistor may be reversed.

In an alternative embodiment, the doping properties of transistor area 230 are reversed, as discussed for transistor area 230 in reference to FIGS. 2A and 2B.

Figure 9:
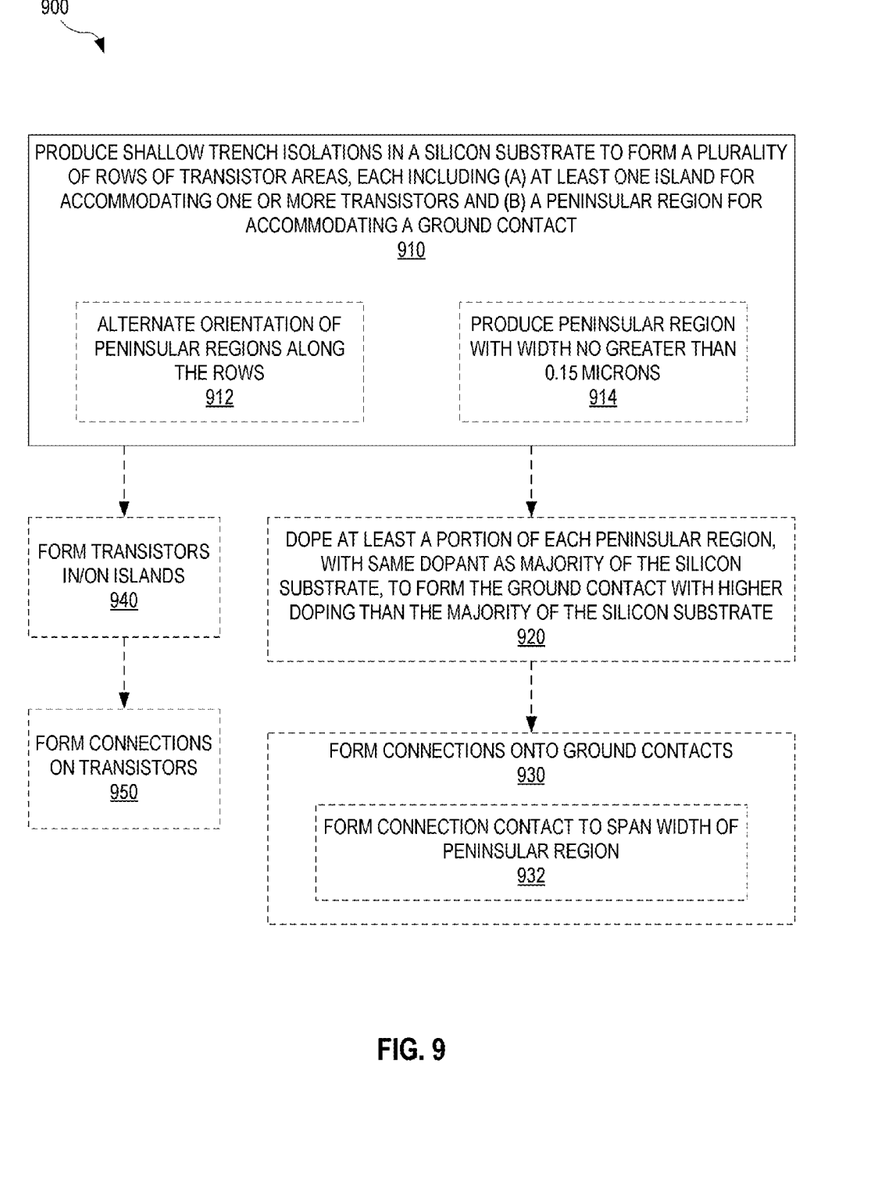
FIG. 9 illustrates a method for manufacturing a CMOS image sensor having peninsular ground contacts, according to an embodiment.

FIG. 9 illustrates one exemplary method 900 for manufacturing a CMOS image sensor having peninsular ground contacts. Method 900 is for example used to manufacture CMOS image sensor 100.

In a step 910, shallow trench isolations are produced in a silicon substrate (or in an alternative substrate such as germanium or silicon-germanium alloy) to form a plurality of rows of transistor areas, wherein each transistor area includes (a) at least one island for accommodating one or more transistors and (b) a peninsular region for accommodating a ground contact. In one example of step 910, shallow trench isolations 140 are produced in substrate 170 to form one or more islands 150 and peninsular region 160. Shallow trench isolations 140 may be produced using methods known in the art.

Step 910 may include a step 912 of alternating the orientation of peninsular regions 160 along the rows. In one example of step 912, shallow trench isolations 140 are formed according to the configuration shown in FIG. 6.

Optionally, step 910 includes a step 914 of producing the peninsular region with width less than 0.15 microns. In one example of step 914, peninsular region 160 is produced with width 286 less than 0.15 microns.

In certain embodiments, method 900 further includes a step 920 of doping at least a portion of each peninsular region with the same dopant as the majority of the substrate to form a ground contact that is more highly doped than the surrounding portions of the substrate. In one example of step 920, a portion of peninsular region 160 is p doped to produce a p+ doped ground contact 262 in p doped well 220. Step 920 may be performed using implant methods known in the art.

Optionally, step 920 is followed by a step 930 of forming connections onto the ground contacts. In one example of step 930, connection 264 is formed on ground contact 262. In another example of step 930, connection 364 is formed on ground contact 262 and some of surrounding shallow trench isolation 140. Step 930 may utilize deposition methods known in the art.

Method 900 may include a step 940 of forming transistors in and on one or more islands of each transistor area. In one example of step 940, one or more transistors 152 are formed in each of one or more islands 150.

Step 940 may be followed by a step 950 of forming connections onto the transistors formed in step 940. In one example of step 940, connections 256 are formed on elements of one or more transistors 152, as shown in FIG. 2B, using methods known in the art. Steps 940 and 930 may be performed concurrently such that connection layer 240 is formed in one step.

Combinations of Features

Features described above as well as those claimed below may be combined in various ways without departing from the scope hereof. For example, it will be appreciated that aspects of CMOS image sensor with peninsular ground contacts, or method of manufacturing the same, described herein may incorporate or swap features of another CMOS image sensor with peninsular ground contacts, or method of manufacturing the same, described herein. The following examples illustrate some possible, non-limiting combinations of embodiments described above. It should be clear that many other changes and modifications may be made to the systems and methods herein without departing from the spirit and scope of this invention:

(A1) A CMOS image sensor with peninsular ground contacts may include (a) a substrate having a plurality of pixel units arranged in rows of pixel units, and (b) a plurality of ground contacts for grounding the pixel units, wherein the ground contacts are formed in respective peninsular regions of the substrate within respective ones of the pixel units, and each of the peninsular regions are only partly enclosed by a shallow trench isolation.

(A2) In the CMOS image sensor denoted as (A1), the peninsular regions may have alternating orientation along each of the rows of pixel units.

(A3) In any of the CMOS image sensors denoted as (A1) and (A2), each of the ground contacts may extend across a respective one of the peninsular regions from one portion of the shallow trench isolation to another portion of the shallow trench isolation.

(A4) In any of the CMOS image sensors denoted as (A1) through (A3), each of the peninsular regions having a shorter dimension that is less than 0.15 microns.

(A5) In any of the CMOS image sensors denoted as (A1) through (A4), each of the ground contacts may be doped with same type of dopant as majority of the substrate, wherein the type of dopant is selected from the group consisting of p-type dopant and n-type dopant.

(A6) In the CMOS image sensor denoted as (A5), each of the ground contacts may be more highly doped than surrounding portions of the substrate.

(A7) In any of the CMOS image sensors denoted as (A1) through (A6), the plurality of pixel units may include a respective plurality of photodiode areas each including at least one photodiode.

(A8) In the CMOS image sensor denoted as (A7), the plurality of pixel units may further include a respective plurality of transistor areas each including (a) a respective one of the ground contacts and (b) at least one transistor communicatively coupled with the at least one photodiode.

(A9) In the CMOS image sensor denoted as (A8), each of the transistor areas may be an elongated rectangle having a longer dimension and a shorter dimension, wherein the longer dimension is parallel to an adjacent side of a corresponding one of the photodiode areas.

(A10) In the CMOS image sensor denoted as (A9), within each of the transistor areas, a respective one of the ground contacts may be located at an extreme end of the longer dimension.

(A11) In any of the CMOS image sensors denoted as (A9) and (A10), the plurality of pixel units may be arranged as a rectangular array with the photodiode areas arranged in a plurality of first rows of the rectangular array and the transistor areas arranged in a plurality of second rows of the rectangular array, wherein the first rows are parallel to the second rows and the first and second rows alternate along a direction orthogonal to the first rows.

(A12) In the CMOS image sensor denoted as (A11), the peninsular regions may have alternating orientation along each of the second rows.

(A13) In any of the CMOS image sensors denoted as (A1) through (A12), within each of the rows of pixel units, the peninsular regions may alternate between (a) having a bridge interrupting the shallow trench isolation in a first direction orthogonal to the rows of pixel units and (b) having a bridge interrupting the shallow trench isolation in a second direction opposite the first direction.

(A14) In any of the CMOS image sensors denoted as (A1) through (A13), each of the ground contacts may extend across a respective one of the peninsular regions in direction parallel to the rows of pixel units from one portion of the shallow trench isolation to another portion of the shallow trench isolation.

(A15) In any of the CMOS image sensors denoted as (A8) through (A14), each of the transistor areas may be an elongated rectangle having a longer dimension and a shorter dimension, wherein the longer dimension is parallel to an adjacent side of a corresponding one of the photodiode areas.

(A16) In the CMOS image sensor denoted as (A15), each of the peninsular regions may have extent in the longer dimension of less than 0.15 microns.

(A17) In any of the CMOS image sensors denoted as (A15) and (A16), each of the transistor areas may include a source-follower transistor having gate length in the longer dimension of least 0.4 microns.

(A18) In any of the CMOS image sensors denoted as (A15) through (A17), for each of the pixel units, all transistors, integrated in the CMOS image sensor and associated with readout of the at least one photodiode, may be located in one or both of the corresponding transistor area and the photodiode area.

(A19) In any of the CMOS image sensors denoted as (A8) through (A18), the at least one transistor may include three transistors.

(A20) In any of the CMOS image sensors denoted as (A8) through (A19), the at least one photodiode may include four photodiodes.

(B1) A method for manufacturing a CMOS image sensor with peninsular ground contacts may include producing shallow trench isolations in a substrate to form a plurality of parallel rows of transistor areas, wherein each of the transistor areas includes (a) at least one island for accommodating one or more transistors, wherein each of the at least one island is fully enclosed by a portion of the shallow trench isolations, and (b) a peninsular region for accommodating a ground contact, wherein the peninsular region is only partly enclosed by a portion of the shallow trench isolations.

(B2) In the method denoted as (B1), the step of producing may include producing the shallow trench isolations to alternate orientation of the peninsular region along each of the rows.

(B3) In any of the methods denoted as (B1) and (B2), the step of producing may include producing the shallow trench isolations such that the peninsular region has width less than 0.15 microns in dimension parallel to the rows.

(B4) Any of the methods denoted as (B1) through (B3) may further include, for each of the transistor areas, forming the ground contact in the peninsular region.

(B5) In the method denoted as (B4), the step of forming the ground contact may include forming the ground contact such that the ground contact spans the width of the peninsular region.

(B6) In any of the methods denoted as (B4) and (B5), the step of forming the ground contact may include doping the peninsular region with the same dopant as the dopant of the majority of the substrate to yield higher doping in the peninsular region than in surrounding portions of the substrate.

(B7) Any of the methods denoted as (B1) through (B6) may further include, for each of the transistor areas, depositing a source-follower transistor gate onto one of the at least one island.

(B8) In the method denoted as (B7), the step of depositing the source-follower transistor gate may include forming the source-follower transistor gate such that the source-follower transistor gate extends at least 0.4 microns along the rows.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present system and method, which, as a matter of language, might be said to fall therebetween.

What is claimed is:

1. A complementary metal oxide semiconductor (CMOS) image sensor with peninsular ground contacts, comprising:
a substrate having a plurality of pixel units arranged in rows of pixel units;
a plurality of ground contacts for grounding the pixel units, the ground contacts being formed in respective peninsular regions of the substrate within respective ones of the pixel units, each of the peninsular regions being only partly enclosed by a shallow trench isolation and being located at top of a trench associated with the shallow trench isolation, the peninsular regions having alternating orientation along each of the rows of pixel units.

2. The CMOS image sensor of claim 1, each of the ground contacts extending across a respective one of the peninsular regions from one portion of the shallow trench isolation to another portion of the shallow trench isolation.

3. The CMOS image sensor of claim 2, each of the peninsular regions having a shorter dimension that is less than 0.15 microns.

4. The CMOS image sensor of claim 1, each of the ground contacts being doped with same type of dopant as majority of the substrate, the type of dopant being selected from the group consisting of p-type dopant and n-type dopant.

5. The CMOS image sensor of claim 4, each of the ground contacts being more highly doped than surrounding portions of the substrate.

6. The CMOS image sensor of claim 1, the plurality of pixel units comprising:
  a respective plurality of photodiode areas each including at least one photodiode; and
  a respective plurality of transistor areas each including (a) a respective one of the ground contacts and (b) at least one transistor communicatively coupled with the at least one photodiode.

7. The CMOS image sensor of claim 6,
  each of the transistor areas being an elongated rectangle having a longer dimension and a shorter dimension, the longer dimension being parallel to an adjacent side of a corresponding one of the photodiode areas; and
  within each of the transistor areas, a respective one of the ground contacts being located at an extreme end of the longer dimension.

8. The CMOS image sensor of claim 6,
  the plurality of pixel units being arranged as a rectangular array with the photodiode areas arranged in a plurality of first rows of the rectangular array and the transistor areas arranged in a plurality of second rows of the rectangular array, the first rows being parallel to the second rows, the first and second rows alternating along a direction orthogonal to the first rows; and
  the peninsular regions having alternating orientation along each of the second rows.

9. The CMOS image sensor of claim 6,
  each of the transistor areas being an elongated rectangle having a longer dimension and a shorter dimension, the longer dimension being parallel to an adjacent side of a corresponding one of the photodiode areas; and
  each of the peninsular regions having extent in the longer dimension of less than 0.15 microns;
  each of the transistor areas including a source-follower transistor having gate length in the longer dimension of least 0.4 microns.

10. The CMOS image sensor of claim 9, each of the ground contacts extending across a respective one of the peninsular regions along the longer dimension from one portion of the shallow trench isolation to another portion of the shallow trench isolation.

11. The CMOS image sensor of claim 9, for each of the pixel units, all transistors, integrated in the CMOS image sensor and associated with readout of the at least one photodiode, being located in one or both of the corresponding transistor area and the photodiode area.

12. The CMOS image sensor of claim 6, the at least one transistor including three transistors.

13. The CMOS image sensor of claim 6, the at least one photodiode including four photodiodes.

14. The CMOS image sensor of claim 1, within each of the rows of pixel units, the peninsular regions alternating between (a) having a bridge interrupting the shallow trench isolation in a first direction orthogonal to the rows of pixel units and (b) having a bridge interrupting the shallow trench isolation in a second direction opposite the first direction.

15. The CMOS image sensor of claim 1, each of the ground contacts extending across a respective one of the peninsular regions in direction parallel to the rows of pixel units from one portion of the shallow trench isolation to another portion of the shallow trench isolation.

16. A method for manufacturing a complementary metal oxide semiconductor (CMOS) image sensor with peninsular ground contacts, comprising:
  producing shallow trench isolations in a substrate to form a plurality of parallel rows of transistor areas, each of the transistor areas including:
    (a) at least one island for accommodating one or more transistors, each of the at least one island being fully enclosed by a first portion of the shallow trench isolations, and
    (b) a peninsular region for accommodating a ground contact, the peninsular region being only partly enclosed by a second portion of the shallow trench isolations and being located at top of a trench associated with the second portion of the shallow trench isolations, and orientation of the peninsular region alternating along each of the rows.

17. The method of claim 16, the step of producing comprising producing the shallow trench isolations such that the peninsular region has width less than 0.15 microns in dimension parallel to the rows.

18. The method of claim 17, further comprising:
  for each of the transistor areas, forming the ground contact in the peninsular region, the ground contact spanning the width of the peninsular region.

19. The method of claim 18, the step of forming the ground contact comprising doping the peninsular region with same dopant as dopant of the majority of the substrate to yield higher doping in the peninsular region than in surrounding portions of the substrate.

20. The method of claim 17, further comprising:
  for each of the transistor areas, depositing a source-follower transistor gate onto one of the at least one island, the source-follower transistor gate having extent along the rows of at least 0.4 microns.

* * * * *